(12) United States Patent
Noh et al.

(10) Patent No.: US 9,666,346 B2
(45) Date of Patent: May 30, 2017

(54) MAGNET PLATE ASSEMBLY, DEPOSITION APPARATUS INCLUDING THE SAME, AND METHOD OF DEPOSITION USING THE SAME

(71) Applicant: Samsung Display Co., Ltd., Yongin (KR)

(72) Inventors: Sokwon Noh, Yongin (KR); Kookchol Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 14/659,684

(22) Filed: Mar. 17, 2015

(65) Prior Publication Data

US 2016/0104561 A1    Apr. 14, 2016

(30) Foreign Application Priority Data

Oct. 8, 2014 (KR) .................. 10-2014-0135960

(51) Int. Cl.
*H01F 7/02* (2006.01)
*C23C 14/04* (2006.01)

(52) U.S. Cl.
CPC .......... *H01F 7/021* (2013.01); *C23C 14/042* (2013.01)

(58) Field of Classification Search
CPC ...... H01F 7/021; H01F 7/0231; H01F 7/0273; C23C 14/042

USPC .......................... 335/296, 302–306
See application file for complete search history.

(56) References Cited

U.S. PATENT DOCUMENTS

| | | | | |
|---|---|---|---|---|
| 6,954,128 B2* | 10/2005 | Humphries | ............. | B03C 1/288 335/285 |
| 7,310,035 B2* | 12/2007 | Wooten | ................. | H01F 7/0252 335/285 |
| 2009/0291610 A1* | 11/2009 | Sasaki | ................... | C23C 14/042 445/24 |
| 2016/0042852 A1* | 2/2016 | Hong | ................... | H01F 7/0221 438/34 |

FOREIGN PATENT DOCUMENTS

| | | |
|---|---|---|
| JP | 1999-350130 | 12/1999 |
| JP | 2005-350712 | 12/2005 |
| KR | 10-2003-0069679 | 8/2003 |
| KR | 10-2011-0017503 | 2/2011 |

* cited by examiner

*Primary Examiner* — Bernard Rojas
(74) *Attorney, Agent, or Firm* — H.C. Park & Associates, PLC

(57) ABSTRACT

Disclosed is a magnet plate assembly that includes a plurality of magnetic bodies, each magnetic body having a first surface formed to correspond to a flat surface of a substrate and to contact the flat surface of the substrate and a second surface formed in a different direction from that of the first surface, and a support frame which supports the plurality of magnetic bodies and has a plurality of grooves in which the plurality of magnetic bodies are respectively seated.

17 Claims, 4 Drawing Sheets

MAGNET PLATE ASSEMBLY, DEPOSITION APPARATUS INCLUDING THE SAME, AND METHOD OF DEPOSITION USING THE SAME

CROSS-REFERENCE TO RELATED APPLICATION

This application claims priority from and the benefit of Korean Patent Application No. 10-2014-0135960, filed on Oct. 8, 2014, which is hereby incorporated by reference for all purposes as if fully set forth herein.

BACKGROUND

Field

Exemplary embodiments relate to a magnet plate assembly, a deposition apparatus including the same, and a method of deposition using the same.

Discussion of the Background

Recently, a variety of flat panel displays that make it possible to reduce the weight and the volume in comparison to cathode ray tube (CRT), have been developed. Typical flat panel displays include liquid crystal display (LCD), field emission display (FED), plasma display panel (PDP), and organic light emitting display device (OLED), etc.

Among the flat panel displays, an organic light-emitting display device has been highlighted as a next-generation display device since the organic light-emitting display device is a self-luminescent display device, has wide-viewing angles and good contrast, may be driven at a low voltage, may be formed to be lightweight and thin, and has quick response times.

In an organic light-emitting display device, an organic layer and/or an electrode may be formed by a vacuum deposition method. However, higher resolution of an organic light-emitting display device requires a narrower width of an open slit of a mask used in a deposition process, which reduces distribution of the width.

In addition, manufacturing a high-resolution display device such as the organic light-emitting display device requires a shadow effect to be reduced or removed. Accordingly, a deposition process is performed with a mask closely attached to a substrate, and technologies to increase adhesion between the substrate and the mask are developed.

One of methods for increasing the adhesion between the substrate and the mask is a method of disposing a yoke plate on one of the surfaces of the substrate, which is opposite to a surface closely contacting the mask, wherein permanent magnets are arranged on the yoke plate at a predetermined interval. The permanent magnets arranged on the yoke plate generate a magnetic field, and when the yoke plate approaches the substrate and the mask before a real deposition process starts, the yoke plate pulls the mask towards the substrate, thereby forcing the mask to uniformly and closely contact the substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a magnet plate assembly, a deposition apparatus including the same, and a method of deposition using the same.

Additional aspects will be set forth in the detailed description which follows, and, in part, will be apparent from the disclosure, or may be learned by practice of the inventive concept.

According to exemplary embodiments, a magnet plate assembly includes: a plurality of magnetic bodies, each magnetic body having a first surface formed to correspond to a flat surface of a substrate and to contact the flat surface of the substrate and a second surface formed in a different direction from that of the first surface; and a support frame which supports the plurality of magnetic bodies and has a plurality of grooves in which the plurality of magnetic bodies are respectively seated.

An angle made by the first surface and the second surface may exceed 0° and be less than 90°.

The plurality of magnetic bodies may include a plurality of first magnetic bodies and a plurality of second magnetic bodies, wherein the plurality of first magnetic bodies and the plurality of second magnetic bodies are alternately disposed, and each of the first magnetic bodies and each of the second magnetic bodies adjacent to the each of the first magnetic bodies are symmetrical to each other.

When the second surface of the each of the first magnetic bodies and the second surface of the each of the second magnetic bodies face each other, first surface side of the each of the first magnetic bodies and first surface side of the each of the second magnetic bodies may have a same polarity.

The first surface may be formed substantially parallel to the flat surface of the substrate.

At a first surface side of each magnetic body, a magnetic field in a direction across the flat surface of the substrate may be formed greater than a magnetic field in a direction parallel to the flat surface of the substrate.

Each of the plurality of magnetic bodies may be a permanent magnet or an electromagnet.

The plurality of magnetic bodies may be disposed such that the second surfaces thereof meet the plurality of grooves.

The plurality of magnetic bodies may be disposed with a constant space.

The each of the first magnetic bodies and the each of the second magnetic bodies adjacent to the each of the first magnetic bodies form a magnetic field in a shape of an inverted triangle.

According to exemplary embodiments, a deposition apparatus includes: a deposition source discharging a deposition material; a mask interposed between the deposition source and a substrate and through which the deposition material passes before being deposited on the substrate; and a magnet plate assembly for applying a magnetic force to the mask by being disposed on a surface of the substrate that is different from a surface of the substrate which contacts the mask, wherein the magnet plate assembly includes: a plurality of magnetic bodies, each magnetic body having a first surface formed to correspond to a flat surface of the substrate and to contact the flat surface of the substrate and a second surface formed in a different direction from that of the first surface; and a support frame which supports the plurality of magnetic bodies and has a plurality of grooves in which the plurality of magnetic bodies are respectively seated.

The deposition apparatus may further include a cool plate which is interposed between the substrate and the magnet plate assembly and presses the substrate.

According to one or more exemplary embodiments, a method of deposition includes: disposing a mask onto one surface of a substrate in a chamber; disposing a magnet plate assembly in a direction of another surface of the substrate, wherein the magnet plate assembly includes: a plurality of magnetic bodies, each magnetic body having a first surface formed to correspond to a flat surface of the substrate and to closely contact the flat surface of the substrate and a second surface formed in a different direction from that of the first surface; and a support frame for supporting the plurality of magnetic bodies; and depositing one or more deposition materials vaporized from a deposition source provided in the chamber onto the substrate through slits formed in the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
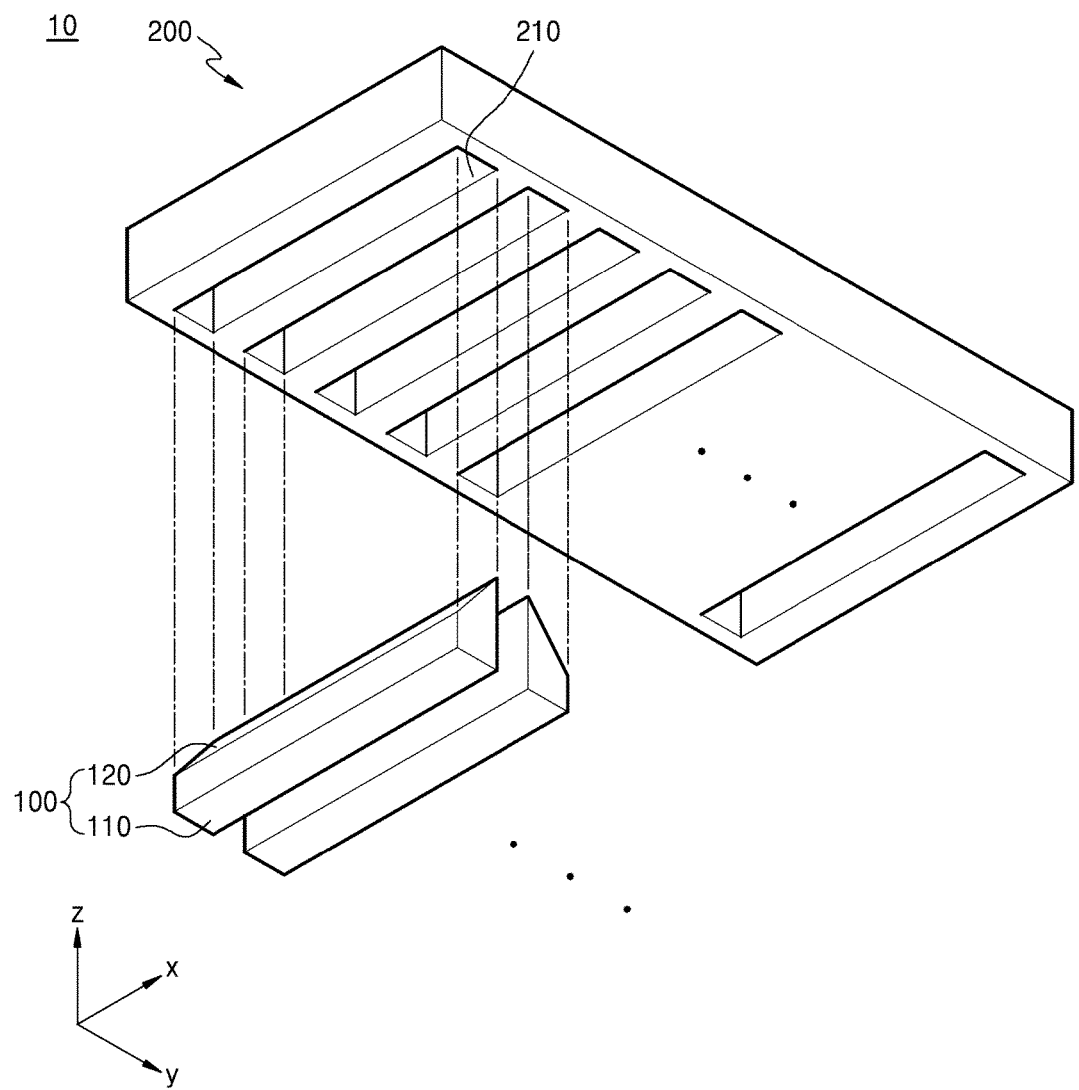
FIG. 1 is a schematic exploded perspective view of a magnet plate assembly according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
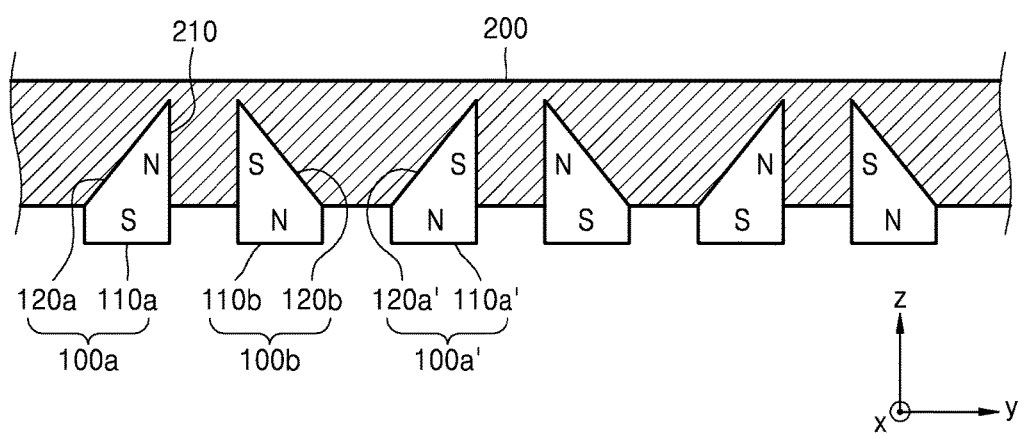
FIG. 2 is a partial side view of the magnet plate assembly of FIG. 1.
Figure 3:
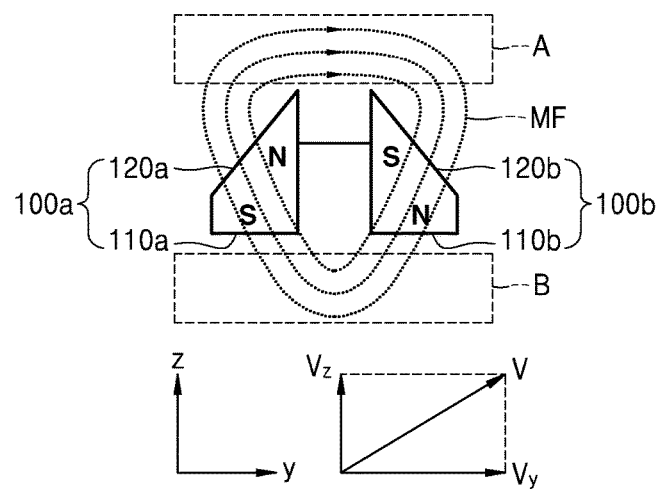
FIG. 3 is a partial side view of a magnetic body in the magnet plate assembly of FIG. 1 and a magnetic field formed by the magnetic body.

FIG. 1 is a schematic exploded perspective view of a magnet plate assembly 10 according to an exemplary embodiment of the inventive concept, FIG. 2 is a partial side view of the magnet plate assembly 10 of FIG. 1, and FIG. 3 is a partial side view of a magnetic body 100 in the magnet plate assembly 10 of FIG. 1 and a magnetic field MF formed by the magnetic body 100.

First, referring to FIGS. 1 and 2, the magnet plate assembly 10 includes a magnetic body 100 and a support frame 200.

The magnetic body 100 has a first surface 110 formed to correspond to a flat surface (surface formed by an x axis and a y axis in FIG. 1) of a substrate (not shown) and to contact the flat surface of the substrate and a second surface 120 formed on an opposite surface of the first surface 110 in a different direction from that of the first surface 110. In addition, the support frame 200 may support the magnetic body 100 and have a plurality of grooves 210 in which the magnetic body 100 is seated.

The magnetic body 100 has a magnetic force. That is, the magnetic body 100 may be a permanent magnet or any other object which is able to generate a magnetic force. For example, an electromagnet which generates a magnetic force by flowing a current therethrough may be used.

The magnetic body 100 may be formed such that when a side of the first surface 110 of the magnetic body 100 exhibits N-pole, a side of the second surface 120 exhibits S-pole, and on the contrary, when the side of the first surface 110 exhibits the S-pole, the side of the second surface 120 exhibits the N-pole, and the magnetic body 100 may be disposed in the plurality of grooves 210 formed in the support frame 200.

In detail, the first surface 110 and the second surface 120 formed in a different direction from that of the first surface 110 may be formed to make an angle from about 0° to about 90°, but when a shape of the magnetic body 100 and a thickness of the support frame 200 in which the plurality of grooves 210 for seating the magnetic body 100 are considered, the angle made by the first surface 110 and the second surface 120 may be about 45°. In addition, the first surface 110 may be formed substantially parallel to the flat surface of the substrate.

Referring to FIG. 2, the magnetic body 100 includes a first magnetic body 100a and a second magnetic body 100b, wherein the first magnetic body 100a and the second magnetic body 100b are alternately disposed such that the first magnetic body 100a and the second magnetic body 100b adjacent to the first magnetic body 100a are symmetrical to each other.

In detail, for example the first magnetic body 100a may be disposed in a shape such that a gradient of the first magnetic body 100a is rising towards the right, and on the contrary, the second magnetic body 100b may be disposed in a shape such that a gradient of the second magnetic body 100b is lowering towards the left. In this case, when a second surface 120a of the first magnetic body 100a faces a second surface 120b of the second magnetic body 100b, that is, as illustrated in FIG. 2 for a second surface 120a' of a first magnetic body 100a' and the second surface 120b of the second magnetic body 100b, a first surface 110a' of the first magnetic body 100a' and the first surface 110b of the second magnetic body 100b may exhibit a same polarity, e.g., the N-pole in FIG. 2.

In addition, among a plurality of magnetic bodies 100, when a first surface 110a of the first magnetic body 100a exhibits the S-pole, a first surface (not shown) of a second magnetic body (not shown), which is adjacent to the first magnetic body 100a and has a second surface (not shown) facing the second surface 120a of the first magnetic body 100a, also exhibits the S-pole.

The arrangement of the plurality of magnetic bodies 100 as described above is to continuously form a magnetic field MF shown in FIG. 3 around the support frame 200. The magnetic field MF shown in FIG. 3 will be described below.

The second surface 120 of the magnetic body 100 may be coupled to the groove 210 formed in the support frame 200 such that the second surface 120 closely contacts the groove 210, and herein, a shape of the groove 210 may be formed to correspond to a shape of the second surface 120.

The magnetic body 100 may be formed in a shape of extending in a width direction (the x-axis direction of FIG. 1) of the support frame 200 and may be disposed plural in number in a length direction (the y-axis direction of FIG. 1) of the support frame 200. In this case, the magnetic bodies 100 may be disposed to be spaced from each other with a constant space, but the present embodiment is not limited thereto, and it will be understood by those of ordinary skill in the art that there may be various modifications.

The groove 210 of the support frame 200 in FIG. 2 is formed such that only a portion of the magnetic body 100 is seated therein, but the present embodiment is not limited thereto, and the groove 210 of the support frame 200 may be formed such that one surface of the support frame 200 in which the groove 210 is formed meets the second surface 120 of the magnetic body 100, i.e., all other portions except the first surface 110 of the magnetic body 100 are seated in the groove 210 of the support frame 200.

Next, a shape of the magnetic field MF formed due to the continuous arrangement of the magnetic body 100 shown in FIGS. 1 and 2 will now be described with reference to FIG. 3.

Referring to FIG. 3, the first magnetic body 100a, which exhibits the S-pole at a side of the first surface 110a and the N-pole at a side of the second surface 120a, and the second magnetic body 100b, which exhibits the N-pole at a side of the first surface 110b and the S-pole at a side of the second surface 120b, form the magnetic field MF in a shape of an inverted triangle.

For convenience of description, it is assumed that a sum of a vector component $V_y$ in the y-axis direction of FIG. 3 and a vector component $V_z$ in the z-axis direction of FIG. 3 is a vector V of the magnetic field MF.

Therefore, the magnetic field MF formed at a side (region A) of the second surfaces 120a and 120b of the first and second magnetic bodies 100a and 100b is formed such that the magnitude of the vector component $V_y$ in the y-axis direction is greater than the magnitude of the vector component $V_z$ in the z-axis direction. On the contrary, the magnetic field MF formed at a side (region B) of the first surfaces 110a and 110b of the first and second magnetic bodies 100a and 100b is formed such that the magnitude of the vector component $V_z$ in the z-axis direction is greater than the magnitude of the vector component $V_y$ in the y-axis direction.

Herein, the y-axis direction indicates a direction parallel to the length direction of the support frame 200, and the z-axis direction indicates a direction parallel to a height direction of the support frame 200. Therefore, as referring to the magnetic field MF in a shape of an inverted triangle in FIG. 3, a large magnitude of the vector component $V_y$ of the magnetic field MF in the y-axis direction indicates that the magnetic field MF is formed strong in the direction parallel to the length direction of the support frame 200 in the region A of FIG. 3, and a large magnitude of the vector component $V_z$ of the magnetic field MF in the z-axis direction indicates that the magnetic field MF is formed strong in a direction across the direction parallel to the length direction of the support frame 200 in the region B of FIG. 3.

In general, when a shape of the magnetic body 100 disposed on the support frame 200 is a square or a rectangle, that is, when the first surface 110 and the second surface 120 of the magnetic body 100 are substantially parallel to each other, a magnetic field MF similar to the magnetic field MF exhibited in the region A of FIG. 3 is formed around the support frame 200. As described above, the magnetic field MF exhibited in the region A is formed strong in the direction parallel to the length direction (the y-axis direction of FIG. 1) of the support frame 200, and when a mask (not shown) is disposed near the support frame 200, the magnetic field MF passes in a length direction of the mask.

Although not shown, the mask forms a deposition region through which a deposition material passes and a non-deposition region at which the deposition material is blocked. In general, a thickness of the deposition region is open or formed thinner than that of the non-deposition region, and accordingly, a stepped portion is formed at a point where the deposition region and the non-deposition region meet. At the stepped portion, a steep gradient is formed due to a thickness difference between the deposition region and the non-deposition region. Due to this steep gradient, when the magnetic field MF passes through the stepped portion, a repulsive force is generated due to concentration of the magnetic field MF at a point where a thickness is relatively thin. When the repulsive force is generated at the stepped portion, the mask is loosened in a direction away from the substrate, and accordingly, a shadow effect occurs such that the deposition material is deposited on a non-desired region of the substrate, thereby causing a defective display.

As described above, when the first surface 110 and the second surface 120 of the magnetic body 100 are formed in different directions according to the present embodiment, like the magnetic field MF formed in the region B of FIG. 3, a magnetic field MF may be formed in the height direction (the z-axis direction of FIG. 1) of the support frame 200, i.e., the direction across the direction parallel to the length direction (the y-axis direction of FIG. 1) of the support frame 200, and when the mask is disposed in the region B, the generation of a repulsive force due to the influence of the magnetic field MF formed in the direction parallel to the length direction of the support frame 200 may be restrained.

Figure 4:
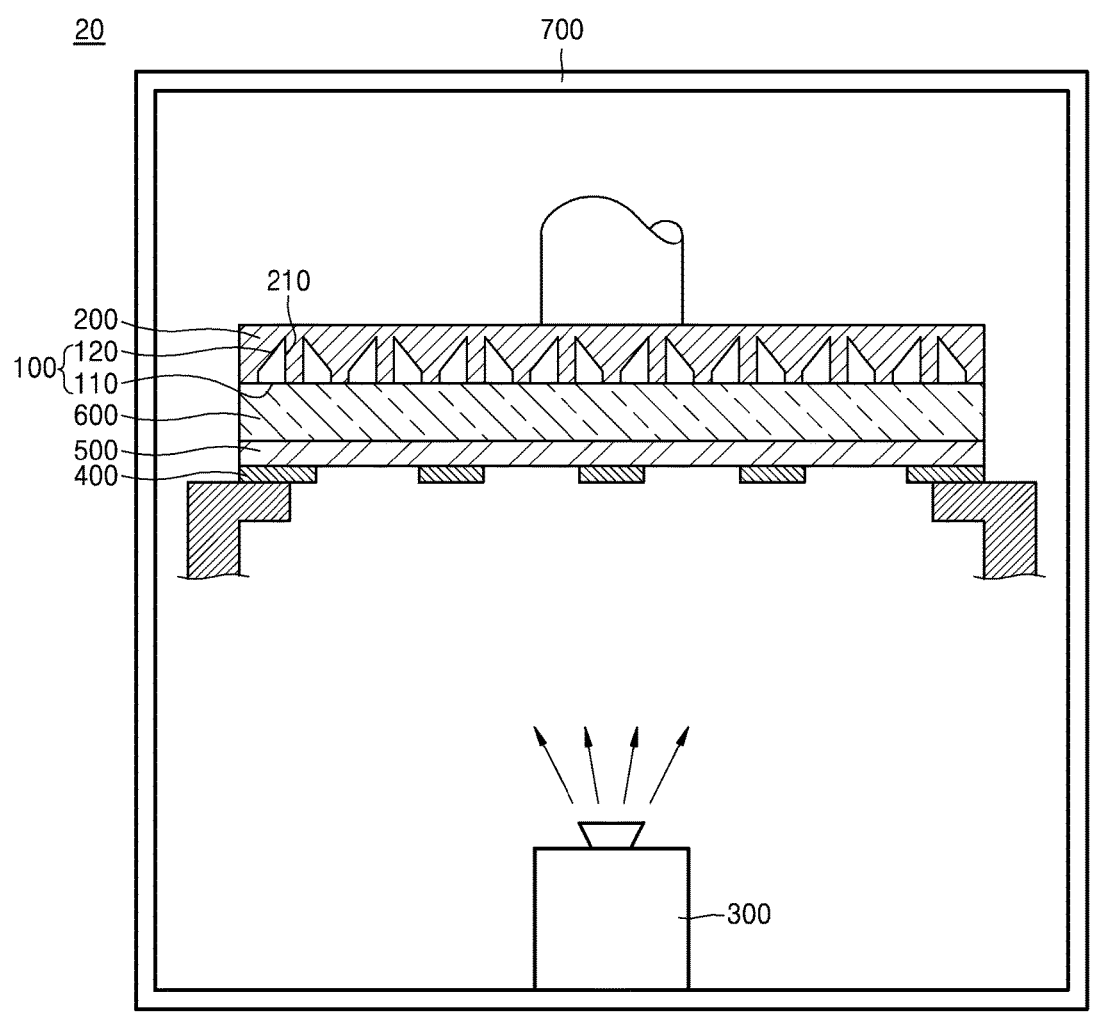
FIG. 4 is conceptual diagram showing a schematic cross-section of a deposition apparatus according to another exemplary embodiment of the inventive concept.

FIG. 4 is conceptual diagram showing a schematic cross-section of a deposition apparatus 20 according to another exemplary embodiment of the inventive concept.

Referring to FIG. 4, the deposition apparatus 20 according to the present embodiment may include a deposition source 300 in the chamber 700 for discharging a deposition material towards a substrate 500, a mask 400 interposed between the deposition source 300 and the substrate 500 to pass the deposition material therethrough so that the deposition material is deposited on the substrate 500, and the magnet plate assembly 10 according to an embodiment of the inventive concept, which is disposed on the other surface of the substrate 500, one surface of which contacts the mask 400, to apply a magnetic force to the mask 400.

As described above, when the magnet plate assembly 10 according to an embodiment of the inventive concept is used to closely contact the mask 400 with the substrate 500, a loose effect between the mask 400 and the substrate 500 may be improved by disposing the mask 400 in the magnetic field MF formed in the height direction of the support frame 200, and accordingly, a shadow effect in a deposition process may be reduced or eliminated, thereby preventing a defective display due to a deposition error.

In addition, the deposition apparatus 20 may further include a cool plate 600 interposed between the substrate 500 and the magnet plate assembly 10 to press the substrate 500 by a weight thereof. The cool plate 600 functions to increase adhesion between the substrate 500 and the mask 400 before the magnet plate assembly 10 moves towards the substrate 500 and applies a magnetic force to the mask 400.

Figure 5:
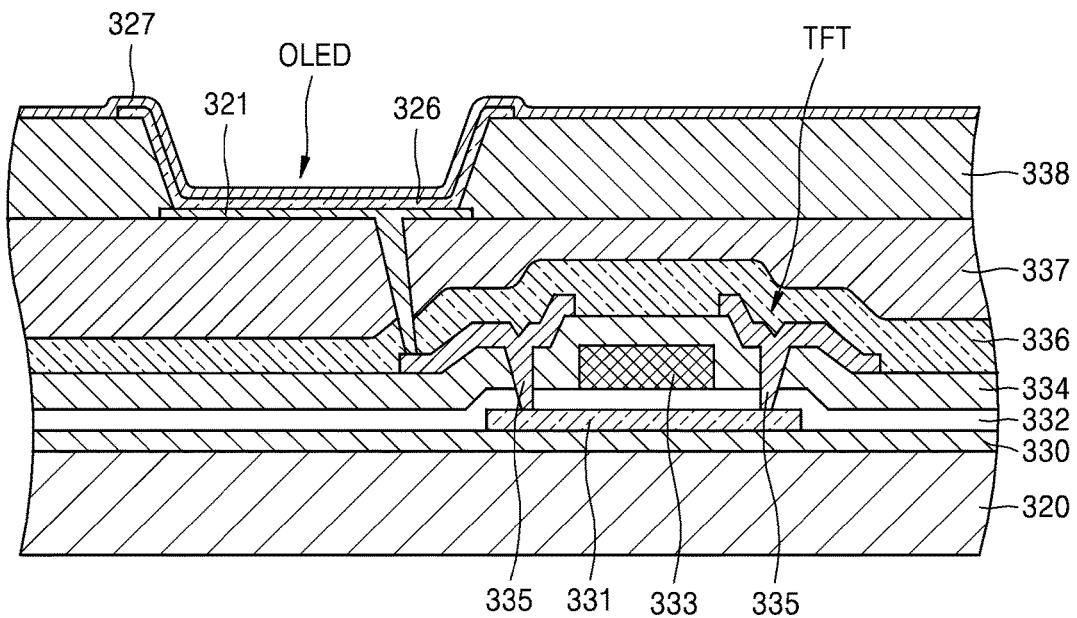
FIG. 5 is a cross-sectional view of an organic light-emitting display device manufactured using the deposition apparatus of FIG. 4, according to another exemplary embodiment of the inventive concept.

FIG. 5 is a cross-sectional view of an organic light-emitting display device manufactured using the deposition apparatus 20 of FIG. 4, according to another exemplary embodiment of the inventive concept.

The organic light-emitting display device manufactured using the deposition apparatus 20 including the magnet plate assembly 10 will now be described with reference to FIGS. 4 and 5.

A buffer layer 330 is formed on a substrate 320, and a thin-film transistor TFT is formed on the buffer layer 330. The thin-film transistor TFT includes a semiconductor active layer 331, a gate insulating layer 332 formed to cover the active layer 331, and a gate electrode 333 on the gate insulating layer 332. An interlayer insulating layer 334 is formed to cover the gate electrode 333, and source and drain electrodes 335 are formed on the interlayer insulating layer 334.

The source and drain electrodes 335 respectively contact source and drain regions of the active layer 331 via contact holes formed in the interlayer insulating layer 334.

A first electrode layer 321, which is an anode electrode of an organic light-emitting diode OLED, is connected to the source and drain electrodes 335. The first electrode layer 321 is formed on a planarization layer 337, and a pixel defining layer 338 is formed to cover the first electrode layer 321. A predetermined opening is formed in the pixel defining layer 338, and thereafter, an organic emission layer 326 of the organic light-emitting diode OLED is formed, and a second electrode layer 327 as a common electrode is deposited on the organic emission layer 326.

The insulating layer, an electrode, and the like may be formed by a deposition method as described in FIG. 4.

In the deposition process, if the magnet plate assembly 10 according to an embodiment of the inventive concept is prepared and used, a shadow effect due to a loosened mask 400 may be reduced or eliminated, thereby precisely depositing a deposition material on the substrate 500.

As described above, according to a magnet plate assembly, a deposition apparatus including the same, and a method of deposition using the same according to the above exemplary embodiments, a shadow effect due to a loosened mask may be reduced or eliminated, thereby precisely depositing a deposition material on a substrate.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A magnet plate assembly, comprising:
a plurality of magnetic bodies, each magnetic body having a first surface formed to correspond to a flat surface of a substrate and to contact the flat surface of the substrate and a second surface formed in a different direction from that of the first surface, the plurality of magnetic bodies comprising a plurality of first magnetic bodies and a plurality of second magnetic bodies; and
a support frame which supports the plurality of magnetic bodies and has a plurality of grooves in which the plurality of magnetic bodies are respectively seated,
wherein the each of the first magnetic bodies and the each of the second magnetic bodies adjacent to the each of the first magnetic bodies form a magnetic field in a shape of an inverted triangle.

2. The magnet plate assembly of claim 1, wherein an angle made by the first surface and the second surface exceeds 0° and is less than 90°.

3. The magnet plate assembly of claim 1,
wherein the plurality of first magnetic bodies and the plurality of second magnetic bodies are alternately disposed, and each of the first magnetic bodies and each of the second magnetic bodies adjacent to the each of the first magnetic bodies are symmetrical to each other.

4. The magnet plate assembly of claim 3, wherein when the second surface of the each of the first magnetic bodies and the second surface of the each of the second magnetic bodies face each other, first surface side of the each of the first magnetic bodies and first surface side of the each of the second magnetic bodies have a same polarity.

5. The magnet plate assembly of claim 1, wherein the first surface of the magnetic body is formed substantially parallel to the flat surface of the substrate.

6. The magnet plate assembly of claim 1, wherein at a first surface side of each magnetic body, a magnetic field in a direction across the flat surface of the substrate is formed greater than a magnetic field in a direction parallel to the flat surface of the substrate.

7. The magnet plate assembly of claim 1, wherein each of the plurality of magnetic bodies is a permanent magnet or an electromagnet.

8. The magnet plate assembly of claim 1, wherein the plurality of magnetic bodies are disposed such that the second surfaces thereof meet the plurality of grooves.

9. The magnet plate assembly of claim 1, wherein the plurality of magnetic bodies are disposed with a constant space.

10. A deposition apparatus, comprising:
a deposition source discharging a deposition material;
a mask interposed between the deposition source and a substrate and through which the deposition material passes before being deposited on the substrate;
a magnet plate assembly for applying a magnetic force to the mask by being disposed on a surface of the substrate that is different from a surface of the substrate which contacts the mask; and
a cool plate which is interposed between the substrate and the magnet plate assembly,
wherein the magnet plate assembly comprises:
a plurality of magnetic bodies, each magnetic body having a first surface formed to correspond to a flat surface of the substrate and to contact the flat surface of the substrate and a second surface formed in a different direction from that of the first surface; and
a support frame which supports the plurality of magnetic bodies and has a plurality of grooves in which the plurality of magnetic bodies are respectively seated.

11. A method of deposition, comprising:
disposing a mask onto one surface of a substrate in a chamber;
disposing a magnet plate assembly in a direction of another surface of the substrate, wherein the magnet plate assembly comprises: a plurality of magnetic bodies, each magnetic body having a first surface formed to correspond to a flat surface of the substrate and to closely contact the flat surface of the substrate and a second surface formed in a different direction from that of the first surface, the plurality of magnetic bodies comprise a plurality of first magnetic bodies and a plurality of second magnetic bodies; and a support frame for supporting the plurality of magnetic bodies; and
depositing one or more deposition materials vaporized from a deposition source provided in the chamber onto the substrate through slits formed in the mask,
wherein the each of the first magnetic bodies and the each of the second magnetic bodies adjacent to the each of the first magnetic bodies form a magnetic field in a shape of an inverted triangle.

12. The method of claim 11, wherein an angle made by the first surface and the second surface exceeds 0° and is less than 90°.

13. The method of claim 11,
wherein the plurality of first magnetic bodies and the plurality of second magnetic bodies are alternately disposed, and each of the first magnetic bodies and each of the second magnetic bodies adjacent to the each of the first magnetic bodies are symmetrical to each other.

14. The method of claim 13, wherein when the second surface of the each of the first magnetic bodies and the second surface of the each of the second magnetic bodies face each other, first surface side of the each of the first magnetic bodies and first surface side of the each of the second magnetic bodies have a same polarity.

15. The method of claim 11, wherein at a first surface side of each magnetic body, a magnetic field in a direction across the flat surface of the substrate is formed greater than a magnetic field in a direction parallel to the flat surface of the substrate.

16. The method of claim 11, wherein each of the plurality of magnetic bodies is a permanent magnet or an electromagnet.

17. The method of claim 11, wherein the plurality of magnetic bodies are disposed such that the second surfaces thereof meet the plurality of grooves.

* * * * *